US009805987B2

(12) United States Patent
Basker et al.

(10) Patent No.: US 9,805,987 B2
(45) Date of Patent: Oct. 31, 2017

(54) SELF-ALIGNED PUNCH THROUGH STOPPER LINER FOR BULK FINFET

(71) Applicant: International Business Machines Corporation, Armonk, NY (US)

(72) Inventors: Veeraraghavan Basker, Schenectady, NY (US); Kangguo Cheng, Schenectady, NY (US); Theodorus Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/845,448

(22) Filed: Sep. 4, 2015

(65) Prior Publication Data

US 2017/0069549 A1    Mar. 9, 2017

(51) Int. Cl.

| H01L 21/8238 | (2006.01) |
|---|---|
| H01L 21/308 | (2006.01) |
| H01L 29/66 | (2006.01) |
| H01L 29/167 | (2006.01) |
| H01L 21/02 | (2006.01) |
| H01L 21/762 | (2006.01) |
| H01L 21/311 | (2006.01) |

(Continued)

(52) U.S. Cl.
CPC .......... *H01L 21/823821* (2013.01); *H01L 21/02112* (2013.01); *H01L 21/3065* (2013.01); *H01L 21/3083* (2013.01); *H01L 21/31051* (2013.01); *H01L 21/31056* (2013.01); *H01L 21/31144* (2013.01); *H01L 21/76224* (2013.01); *H01L 21/823807* (2013.01); *H01L 21/823878* (2013.01); *H01L 27/0924* (2013.01); *H01L 29/1083* (2013.01); *H01L 29/167* (2013.01); *H01L 29/66795* (2013.01)

(58) Field of Classification Search
None
See application file for complete search history.

(56) References Cited

U.S. PATENT DOCUMENTS

| 7,955,928 B2 | 6/2011 | Chan et al. |
|---|---|---|
| 8,394,690 B2 | 3/2013 | Ikeda et al. |

(Continued)

OTHER PUBLICATIONS

List of IBM Patents or Patent Applications Treated as Related; (Appendix P), Filed Feb. 3, 2016; 2 pages.

(Continued)

*Primary Examiner* — William Coleman
*Assistant Examiner* — Kien Ly
(74) *Attorney, Agent, or Firm* — Cantor Colburn LLP; Vazken Alexanian

(57) ABSTRACT

A technique relates to forming a self-aligning field effect transistor. A starting punch through stopper comprising a substrate having a plurality of fins patterned thereon, an n-type field effect transistor (NFET) region, a p-type field effect transistor (PFET) region, and a center region having a boundary defect at the interface of the NFET region and the PFET region is first provided. The field effect transistor is then masked to mask the NFET region and the PFET region such that the center region is exposed. A center boundary region is then formed by etching the center region to remove the boundary defect.

15 Claims, 9 Drawing Sheets

(51) Int. Cl.
   *H01L 21/3105*  (2006.01)
   *H01L 29/10*    (2006.01)
   *H01L 27/092*   (2006.01)
   *H01L 21/3065*  (2006.01)

(56) References Cited

U.S. PATENT DOCUMENTS

| | | | |
|---|---|---|---|
| 8,394,710 B2 | 3/2013 | Cheng et al. | |
| 8,420,459 B1 | 4/2013 | Cheng et al. | |
| 8,610,201 B1 | 12/2013 | Hokazono | |
| 8,674,413 B1* | 3/2014 | Chi | H01L 21/823821 257/213 |
| 8,932,918 B2 | 1/2015 | Cheng et al. | |
| 9,023,715 B2 | 5/2015 | Faul et al. | |
| 9,455,204 B1* | 9/2016 | Cao | H01L 21/823892 |
| 2011/0074498 A1* | 3/2011 | Thompson | H01L 21/823412 327/543 |
| 2012/0100686 A1* | 4/2012 | Lu | H01L 21/26586 438/303 |
| 2013/0244387 A1* | 9/2013 | Cho | H01L 21/76224 438/283 |
| 2013/0280883 A1 | 10/2013 | Faul et al. | |
| 2014/0117462 A1 | 5/2014 | Cheng et al. | |
| 2014/0217467 A1* | 8/2014 | Pawlak | H01L 29/12 257/183 |
| 2014/0315371 A1* | 10/2014 | Cai | H01L 21/823821 438/424 |
| 2015/0021672 A1* | 1/2015 | Chuang | H01L 21/28088 257/288 |
| 2015/0044829 A1* | 2/2015 | Kim | H01L 21/823807 438/199 |
| 2015/0079773 A1* | 3/2015 | Basker | H01L 21/18 438/510 |
| 2015/0179503 A1* | 6/2015 | Tsai | H01L 21/76224 257/347 |
| 2015/0206953 A1* | 7/2015 | Basker | H01L 29/66795 257/192 |
| 2015/0235905 A1* | 8/2015 | Liaw | H01L 21/823481 438/283 |
| 2015/0255457 A1* | 9/2015 | Loubet | H01L 27/0886 257/77 |
| 2015/0270263 A1* | 9/2015 | Zhu | H01L 21/02274 257/386 |
| 2015/0279970 A1* | 10/2015 | Zhang | H01L 29/66795 438/157 |
| 2015/0340290 A1* | 11/2015 | Zhu | H01L 21/823821 257/401 |
| 2015/0372144 A1* | 12/2015 | Fang | H01L 29/7851 257/192 |
| 2016/0211338 A1* | 7/2016 | Wang | H01L 21/823481 |
| 2017/0053835 A1* | 2/2017 | Sung | H01L 21/823821 |
| 2017/0076993 A1 | 3/2017 | Basker et al. | |

OTHER PUBLICATIONS

Veeraraghavan Basker, et al., "Self-Aligned Punch Through Stopper Liner for Bulk FinFET", U.S. Appl. No. 14/950,583, filed Nov. 24, 2015.

List of IBM Patents or Patent Applications Treated as Related (Appendix P); Filed Sep. 4, 2015, 2 pages.

\* cited by examiner

SELF-ALIGNED PUNCH THROUGH STOPPER LINER FOR BULK FINFET

BACKGROUND

The present invention relates to metal-oxide-semiconductor field-effect transistors (MOSFET), and more specifically, to fin-type field-effect transistors (FinFET).

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and is built with n-doped source and drain junctions. The PFET uses holes as the current carriers and is built with p-doped source and drain junctions.

The fin-type field effect transistor (FinFET) is a type of MOSFET. The FinFET contains a conformal gate around the fin that mitigates the effects of short channels and reduces drain-induced barrier lowering. The "fin" refers to the narrow channel between source and drain regions. Often, a thin insulating high-k gate oxide layer around the fin separates the fin channel from the gate metal.

SUMMARY

According to an embodiment of the present invention, a method of making a self-aligned field effect transistor structure is provided. The method includes providing a starting punch through stopper comprising a substrate having a plurality of fins patterned thereon, an n-type field effect transistor (NFET) region, a p-type field effect transistor (PFET) region, and a center region having a boundary defect at the interface of the NFET region and the PFET region. In some aspects, the method further includes masking the NFET region and the PFET region such that the center region is exposed and etching the center boundary region to remove the boundary defect.

According to one embodiment, a method of making a self-aligned field effect transistor structure is provided. The method includes providing a starting punch through stopper comprising a substrate having a plurality of fins patterned thereon, an n-type field effect transistor (NFET) region having a boron doped layer deposited over at least one of the plurality of fins, a p-type field effect transistor (PFET) region having a phosphorous or arsenic doped layer deposited over at least one of the plurality of fins, and a center region having a boundary defect at the interface of the NFET region having the boron doped layer deposited thereon and the PFET region having the phosphorous or arsenic doped layer deposited thereon. The method further includes masking the NFET region having the boron doped layer deposited thereon and the PFET region having a phosphorous doped layer deposited thereon such that the center region is exposed and etching the center boundary region to remove the boundary defect. Additionally, the method includes removing the mask covering the NFET region having the boron doped layer deposited thereon and the PFET region having a phosphorous doped layer, filling the etched center boundary region with an insulator material, and planarizing the punch through stopper having the center boundary region filled with the insulator material. Further, the method includes revealing a portion of the plurality of fins patterned in the substrate such that at least a portion of the boron doped layer adjacent to the fins forming the NFET region and at least a portion of the phosphorous or arsenic doped layer adjacent to the fins forming the PFET region is revealed and doping a portion of the fins and substrate that is adjacent to the boron doped layer with boron type dopants and doping a portion of the fins and substrate that are adjacent to the phosphorous or arsenic doped layer with phosphorous or arsenic type dopants.

According to one embodiment, a self-aligned field effect transistor structure is provided. The self-aligned field effect transistor structure includes a bulk substrate having a plurality of fins patterned therein. The self-aligned field effect transistor structure also includes an n-type field effect transistor region formed of at least one of the plurality of fins patterned on the substrate, the n-type field effect transistor region having a boron doped layer formed therein, and a p-type field effect transistor region formed of at least one of the plurality of fins patterned on the substrate, the p-type field effect transistor region having a phosphorous or arsenic doped layer formed therein. Furthermore, the self-aligned field effect transistor structure includes a boundary region between the n-type filed effect transistor region and the p-type field effect transistor region comprising an insulator material disposed between the n-type filed effect transistor region and the p-type field effect transistor region such that there is a separation between the boron doped layer of the n-type filed effect transistor region and the phosphorous or arsenic doped layer of the p-type field effect transistor region.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 3-7 illustrate an example boundary cut process used to selectively cut a boundary portion of a PTS and any defect that exists therein, wherein:

FIG. 3 is a cross-section view of the starting PTS having fin cut masks formed thereon to create a cut region;

FIG. 5 is a cross-sectional view of a planarized PTS having the center region filled with an STI oxide;

FIG. 6 is a cross-sectional view of the PTS having a portion of the fins revealed such that a portion of the BSG layer and PSG layer is exposed;

FIG. 7 is a cross-sectional view of the PTS having doped portions of the fins and substrate that are adjacent to the BSG layer and PSG layer.

DETAILED DESCRIPTION

Figure 1:
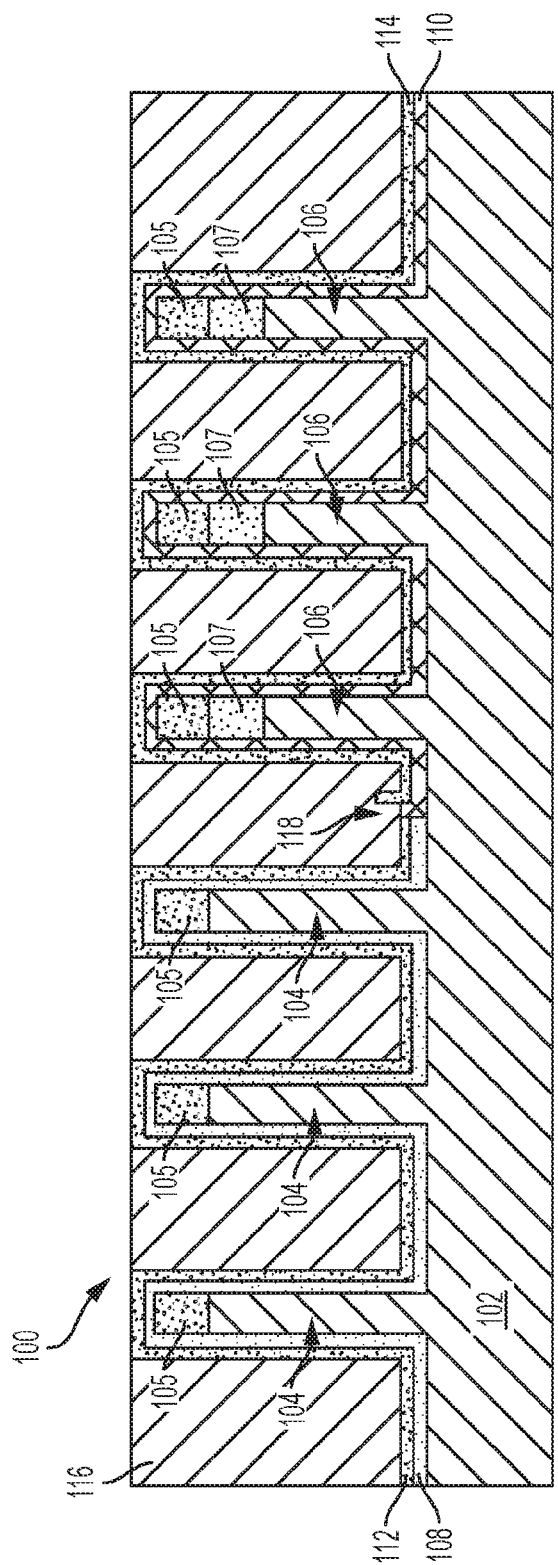
FIG. 1 is a cross-sectional side view of an example starting FET with a fin structure and punch through stopper (PTS) having a boundary defect.

As stated above, the present invention relates to MOSFETs, and particularly to interconnect technology, which are now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Punch through stopper (PTS) formation is a process to form doped regions below active fins to prevent source/drain (S/D) leakage. Traditional methods of forming the PTS uses boron (B) doped silicate glass layers (BSG) and phosphorous (P) doped silicate glass (PSG) layers. Besides BSG and PSG, any other suitable material containing boron or phosphorus can also be used as dopant sources. Furthermore, arsenic doped material can be used in lieu of PSG as n-type dopant source. In some aspects, BSG layers can be utilized with NFET, and PSG layers are utilized with PFET. It is through film patterning processes that BSG layers for NFET and PSG layers for PFET are made. This process, however, requires strict control of process alignment, such as over block layers and often may leave a stringer-type defect at the boundary between the NFET and PFET. Thus, as is discussed below, it may be desirable to remove these boundary defects.

FIG. 1 is a cross-sectional side view of an example starting FET with a fin structure and punch through stopper (PTS) having the above discussed boundary defect. As used herein, "punch through stopper (PTS)" refers to a portion of a fin that is doped under the fin channel. As shown, a starting FET structure 100 is a starting PTS structure that includes a plurality of fins 104, 106 patterned in a bulk substrate 102. A first group of fins 104 defines an NFET region of the FET 100 while a second group of fins 106 forms a PFET region of the FET 100. In some aspects, the fins 104b, 106b that are immediately adjacent the center region containing a defect 118, as is discussed in more detail below with respect to FIG. 3, can be dummy fins. That is, these fins 104b, 106b immediately adjacent a defect 118 can be non-active device fins to be removed later.

Moreover, as will be discussed in more detail below, the fins 104 can include a hardmask layer 105 formed above the substrate fin-forming material. Similarly, the fins 106 can include a hardmask layer 105 and additionally can include a second substrate layer 107 that is formed of a different material than substrate 102. For example, the second substrate layer 107 can be formed of a silicon germanium (SiGe) material. Immediately above the substrate 102 in the NFET region is a boron (B) doped layer (BSG) 108. Similarly, directly above the substrate 102 on the PFET side is a phosphorous (P) doped (PSG) layer 110. Above the BSG layer 108 and PSG layer 110 are hardmask layers 112, 114. In some aspects, the hardmask layers are formed of silicon nitride (SiN). Furthermore, the starting FET 100 includes an insulator layer 116, such as a Shallow Trench Isolation (STI) oxide layer or any suitable insulator material that sits above the respective hardmask layers 112, 114.

This starting FET 100, as is shown in FIG. 1, contains a boundary defect 118 that occurs at the boundary between the NFET and PFET. Specifically, the defect 118 can include stringers formed in the PSG layer 110 and hardmask layer 114 at the point where the PSG layer 110 and hardmask layer 114 meets the BSG layer 108 and its hardmask layer 112. This defect 118 is a result of the variations of deposition and patterning process used to form the starting FET 100 shown in FIG. 1. Since the defect 118 contains both BSG and PSG, both boron and phosphorus (or arsenic as described herein) simultaneously diffuse towards adjacent regions, leading to undesired variation of dopant concentration and thus variation of device characteristics. This process is detailed in FIG. 2.

Figure 2:
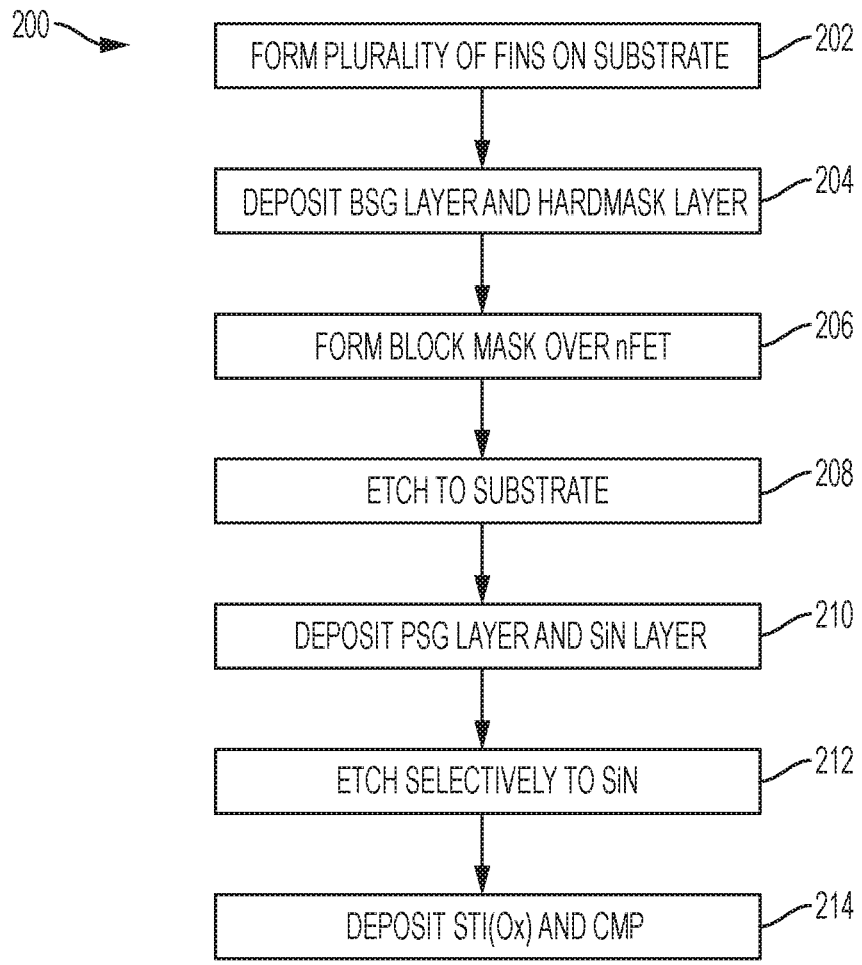
FIG. 2 is an example conventional method of forming the FET of FIG. 1.

FIG. 2 illustrates a block diagram of an exemplary PTS forming process 200 that creates the starting FET 100 shown in FIG. 1. As shown, the PTS forming process 200 includes a first step 202 of forming a plurality of fins on a substrate. The substrate formed in this first step 202, such as substrate 102 shown and described in FIG. 1, can be formed of any suitable substrate material. In some aspects the substrate is bulk silicon substrate. Non-limiting examples of suitable substrate materials include silicon, silicon dioxide, aluminum oxide, sapphire, germanium, gallium arsenide (GaAs), an alloy of silicon and germanium, indium phosphide (InP), or any combination thereof. The thickness of the substrate is not intended to be limited.

As will be appreciated by those of ordinary skill in the art, the plurality of fins can be formed on the substrate using a variety of suitable techniques. For example, fins can be formed in the substrate using a time-based anisotropic etching process that utilizes a hardmask layer and resist patterns to protect the fin-forming substrate from removal during the etching process. Alternatively, fins can be formed by sidewall imaging transfer (SIT) technique. In some aspects, for example, the fins—such as fins 104, 106—can have height of about 50 nanometers to 150 nanometers and a thickness of about 5 nanometers to about 15 nanometers, although any desired height and thickness can be achieved.

In some embodiments, the fin forming step 202 can include a step that produces a second substrate material in at least some of the fins. For example, a silicon germanium layer 107 can be formed, such as by epitaxial growth, on a PFET group of fins, as is shown in FIG. 1. As will be appreciated by one of ordinary skill in the art, a silicon germanium layer can be formed by deposition with a chemical vapor deposition process or growth with a surface reaction epitaxy process. In some embodiments, fins 104, 106 contain similar materials, such as silicon. In other embodiment, fins 104, 106 contain different materials, for example, silicon fins for NFET and silicon germanium fins for PFET.

Further, the step 204 includes depositing a BSG layer on the substrate and plurality of fins. Specifically, a chemical vapor deposition (CVD) or atomic layer deposition (ALD) process can be used to form the BSG layer across the substrate and fins. After the BSG layer is deposited, a hardmask layer, such as SiN, can be formed above the BSG layer, which now covers both the NFET and PFET fins. The insulating hardmask layer can be any suitable hardmask, for example, silicon nitride (SiN), SiOCN, or SiBCN. It will be appreciated that layers other than boron doped layers can be utilized. For example indium doped oxide, indium doped silicate glass layers can be used. The BSG layer thickness ranges from 1 nanometer (nm) to 10 nanometers (nm), although thicker or thinner BSG layers are also conceived. The hardmask layer thickness ranges from 1 nanometer (nm) to 10 nanometer (nm), although thicker or thinner BSG layers are also conceived.

The process 200 can next include the step 206 of forming a block mask over the NFET portion of the PTS in order to preserve the BSG layer from future etching. With the BSG layer masked as desired, the process 200 can include the step 208 of selectively etching to the substrate. In this step 208, the BSG layer is removed from the PFET side of the substrate and fins.

Next, in step 210, a PSG layer can be deposited over the PFET portion of the FET. Just as with the BSG deposition, the PSG deposition process can include either chemical vapor deposition (CVD) or atomic layer deposition (ALD). It will be appreciated that layers other than phosphorous doped layers can be utilized. For example phosphorus doped oxide, arsenic doped oxide, and arsenic doped silicate glass doped layers can be used. This step 210 can also include deposition of a hardmask, such as SiN, layer. It is at this point in the process 200 that boundary defects between the PFET and NFET portions are produced during the deposition of the PSG and SiN mask layers adjacent to the BSG layer and its corresponding SiN mask layer, such as is shown by defect region 118 in FIG. 1. The PSG layer thickness ranges from 1 nanometer (nm) to 10 nanometers (nm), although thicker or thinner PSG layers are also conceived.

Next, any mask layers that may be present over the PTS at this point can be removed in step 212, which includes selectively etching to the hardmask layers that were deposited above the BSP and PSG layers. Lastly, to form the starting FET 100 of FIG. 1, a layer of STI oxide can be formed over the body of the PTS and planarized to the top of the fins using a chemical mechanical polishing (CMP) process. As such, a starting PTS is formed that has the above described boundary defect that now must be removed.

FIGS. 3-7 illustrate an example boundary cut process used to selectively cut, or remove, the boundary portion of the PTS and any defect that exists therein.

Figure 3:
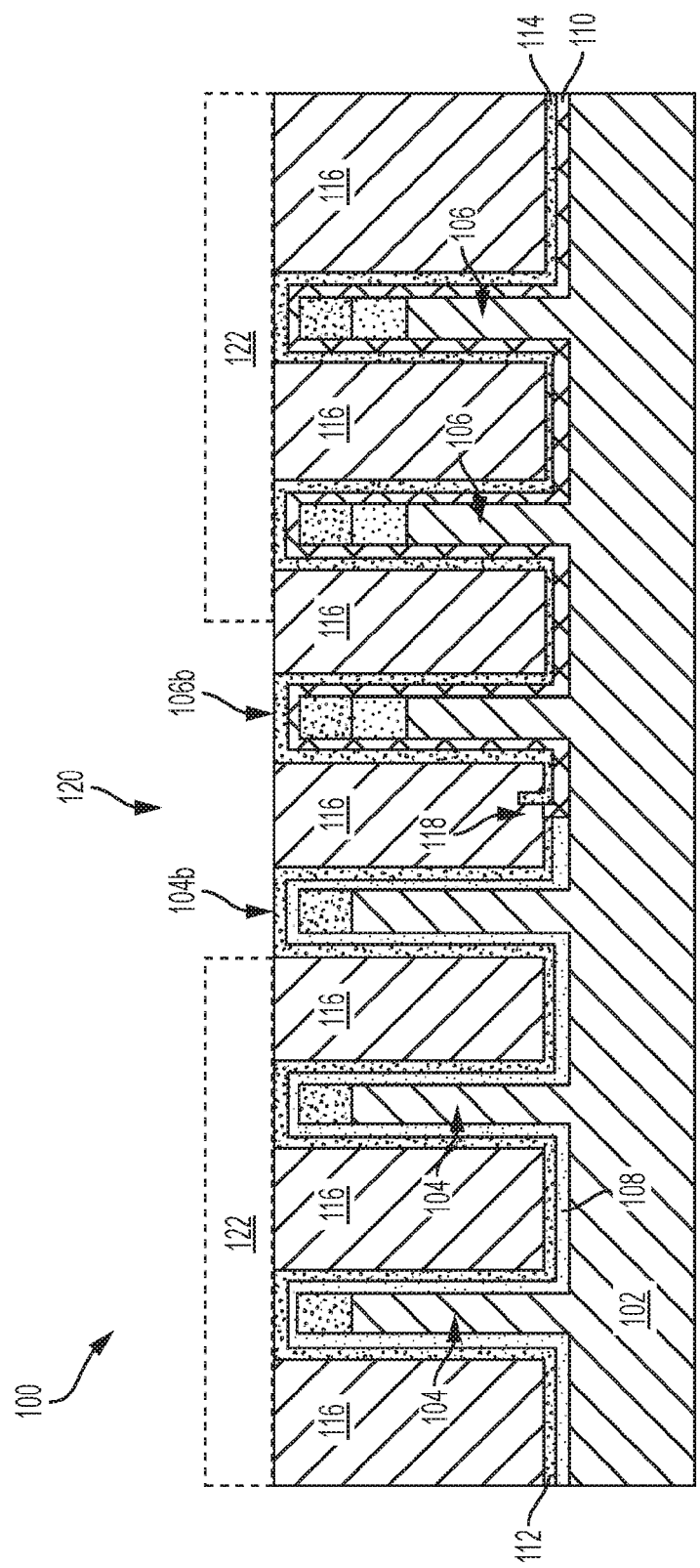

FIG. 3 is a cross-section view of the starting PTS having fin cut masks formed thereon to create a cut region. As shown in FIG. 3, the starting FET 100 is prepared to have a center, boundary region 120 removed, while maintaining the peripheral fins 104, 106 intact to form source/drain (S/D) active regions later in the process. Specifically, the center, boundary region 120 can include at least one boundary fin 104b and at least one boundary fin 106b. As shown in FIG. 3, in order to protect the peripheral fins 104, 106 from the boundary cut process, the peripheral fins 104, 106 are covered with a fin cut mask 122. The fin cut masks 122 can be formed by suitable masking techniques, such as photolithographic deposition and patterning.

Figure 4A:
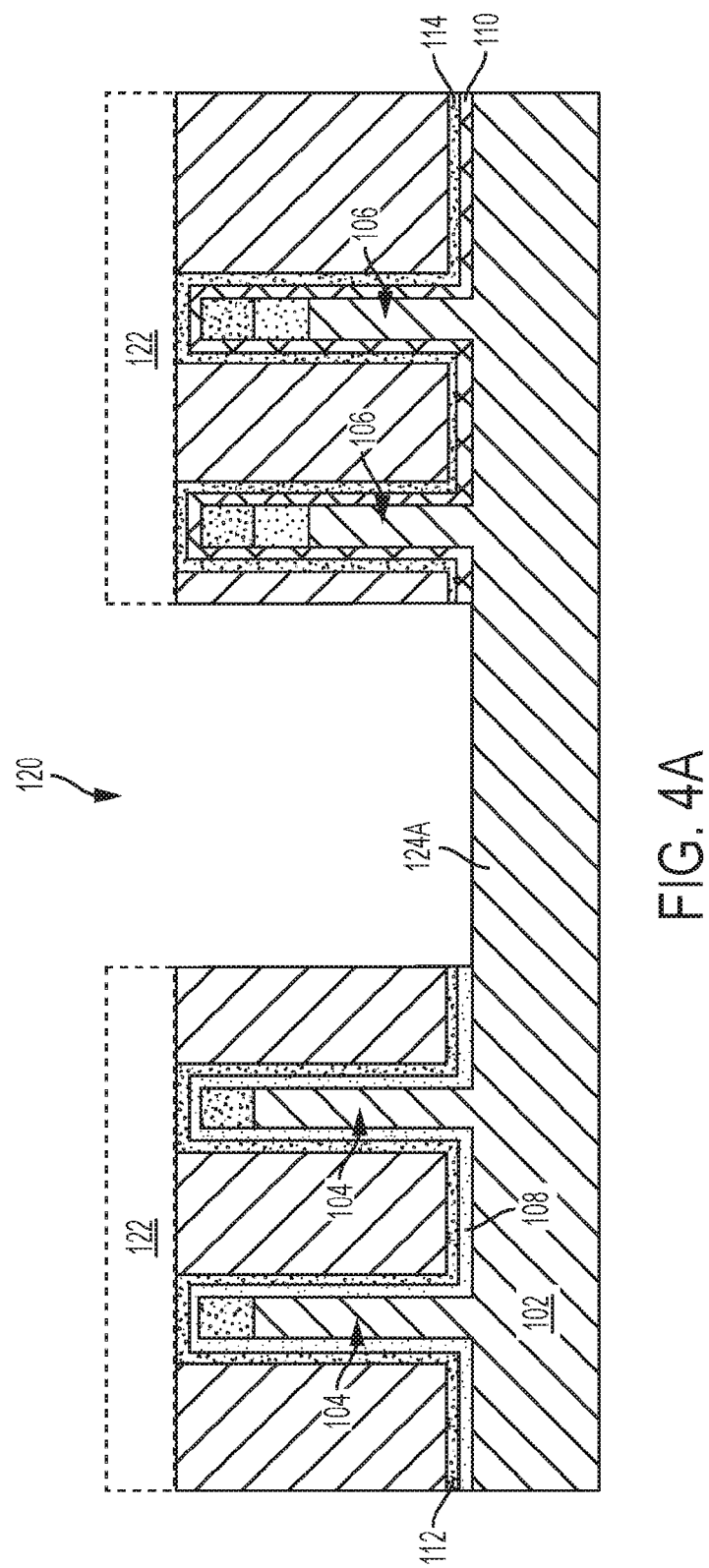
FIG. 4A is a cross-sectional view of the PTS having the center region cut such that the cut stops at an upper surface of the substrate 102.
Figure 4B:
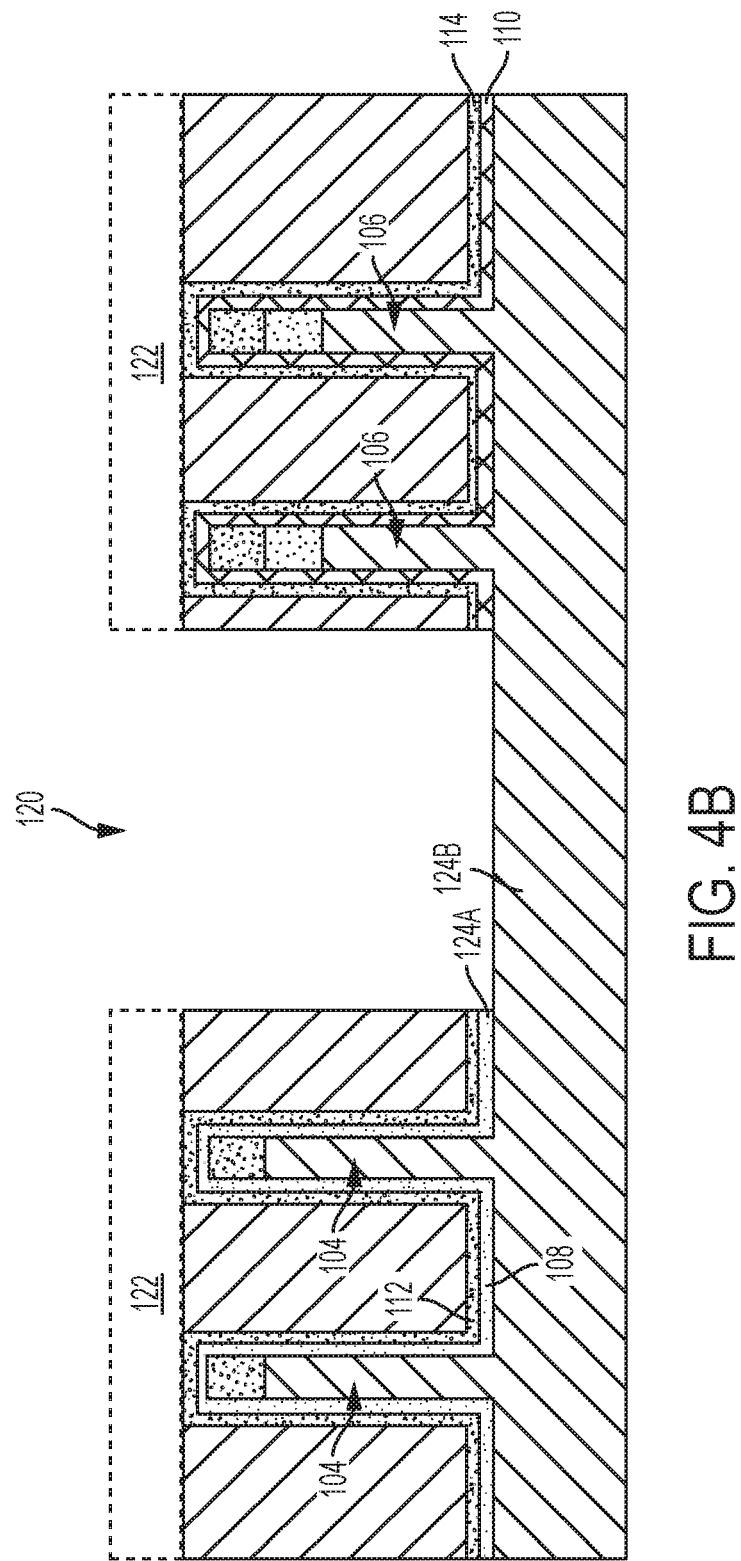
FIG. 4B is a cross-sectional view of the PTS having the center region cut such that the cut stops at a surface that is just below an upper surface of the substrate.

FIG. 4A is a cross-sectional view of the FET 100 having the center region 120 cut such that the etch stops at an upper surface 124A of the substrate 102. FIG. 4B is a cross-sectional view of the FET 100 having the center region 120 cut such that the etch stops at a surface 124B that is just below an upper surface 124A of the substrate 102. After masking the peripheral NFET and PFET regions as shown in FIG. 3, the center, boundary region 120 is cut to remove the boundary fins 104b, 106b (sometimes referred to as dummy fins), the surrounding oxide layer 116 that is in the unmasked center region 120, as well as the boundary defect 118. The cut can be performed with any suitable method, such as an etching process. For example, either chemically selective isotropic or anisotropic etches or timed isotropic or anisotropic etches can be utilized. For example, in some aspects a reactive ion etch (RIE) process is used. In some aspects, however, fins 104b, 106b are cut and in these aspects, a timed etch can be used. As shown in FIG. 4A, this cutting process can be performed such that the etch stops at the upper most surface 124A of the substrate 102. In some aspects, the cutting process can be performed such that the etch stops at a surface 124B that is just below the upper most surface 124A of the substrate 102. Thus, in the illustrated embodiment of FIG. 4B, the etching process removes a portion of the exposed substrate 102.

Figure 5:
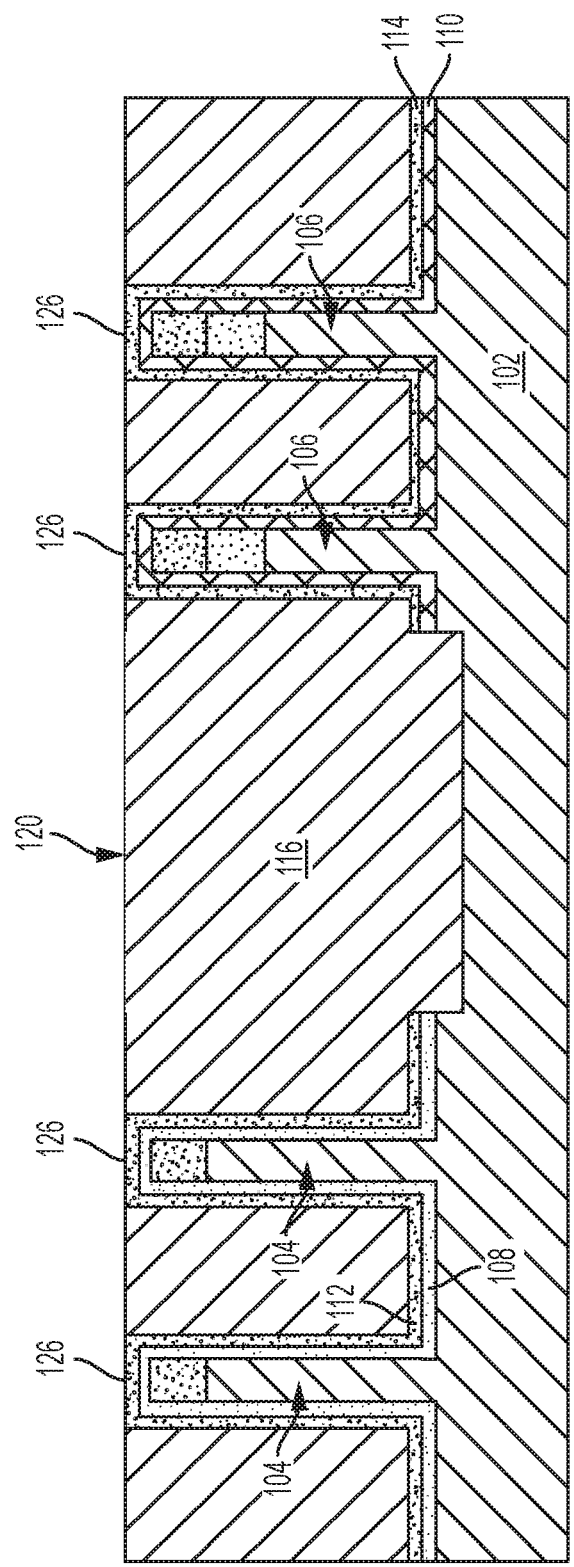

FIG. 5 is a cross-sectional view of a planarized FET 100 having the center region 120 filled with an STI oxide. Once the center region 122 containing any boundary defect 118 is removed, i.e., cut, the fin cut masks 118 can be removed and the center region 122 can be filled with an insulator 116, such as a Shallow Trench Isolation (STI) oxide, using suitable techniques. For example, the entire punch through structure can be filled with the insulator, thus filling in the center region 118. Once the center region is filled, the FET 100 can be planarized using a chemical mechanical polish (CMP) procedure. In some aspects, the planarization can be terminated at the upper-most hardmask layer 126 disposed on the fins.

Figure 6:
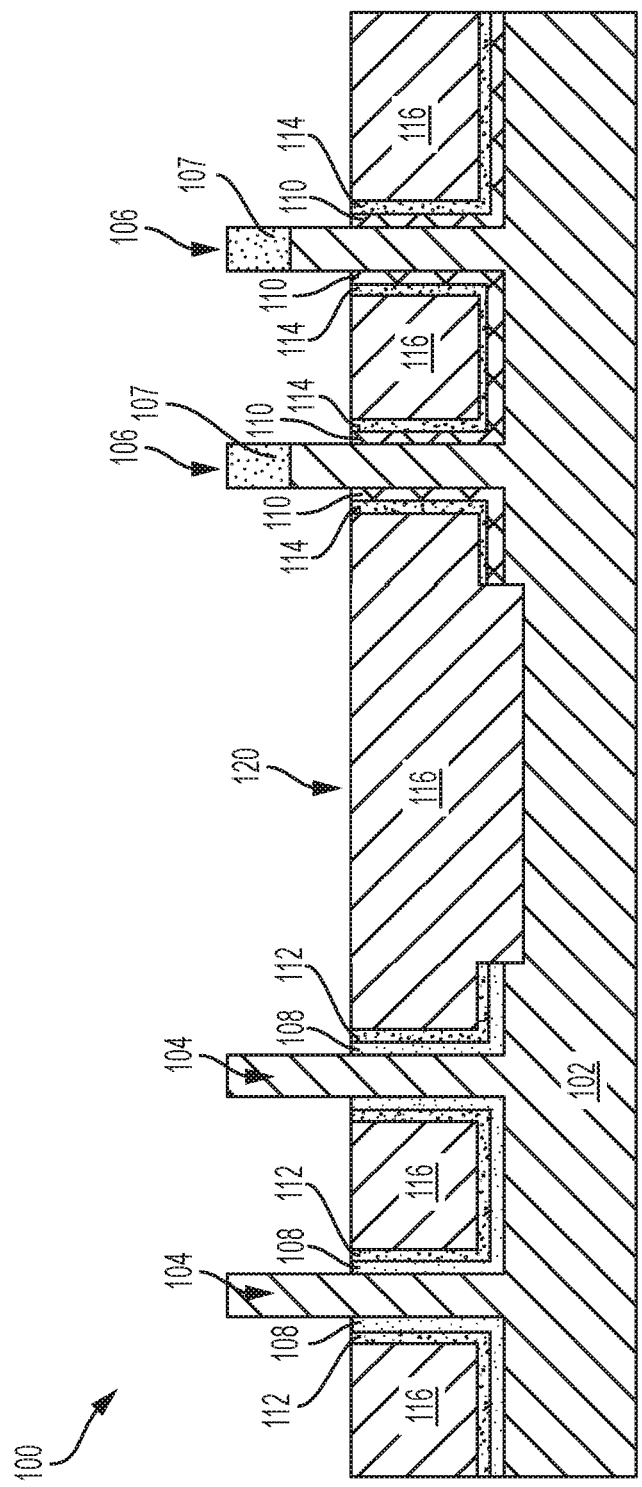

FIG. 6 is a cross-sectional view of the FET 100 having a portion of the fins 104, 106 revealed such that a portion of the BSG layer 108 and PSG layer 110 is exposed. By exposing portions of the fins 104, 106 as shown, the fins are prepared for gate formation steps as will be discussed below. Moreover, by revealing the fins in such a manner as to additionally reveal the BSG layer 108 and PSG layers 110, the portions of the fins 104, 106 and substrate 102 that are adjacent to the BSG 108 and PSG 110 layers can be doped in an annealing step. To reveal the fins, suitable etching techniques, including anisotropic and isotropic etching, can be utilized to remove a specified depth of STI oxide 116 as well as portions of the BSG layer 108, PSG layer 110, and hardmask layers 105, 112, 114 that are adjacent to the fins 104, 106. As is shown in FIG. 6, the fin-reveal etch can be selective for the silicon and/or silicon germanium substrate materials 107 such that only the fin structure remains intact. In some aspects, the fin-reveal etch can be a timed etch.

Figure 7:
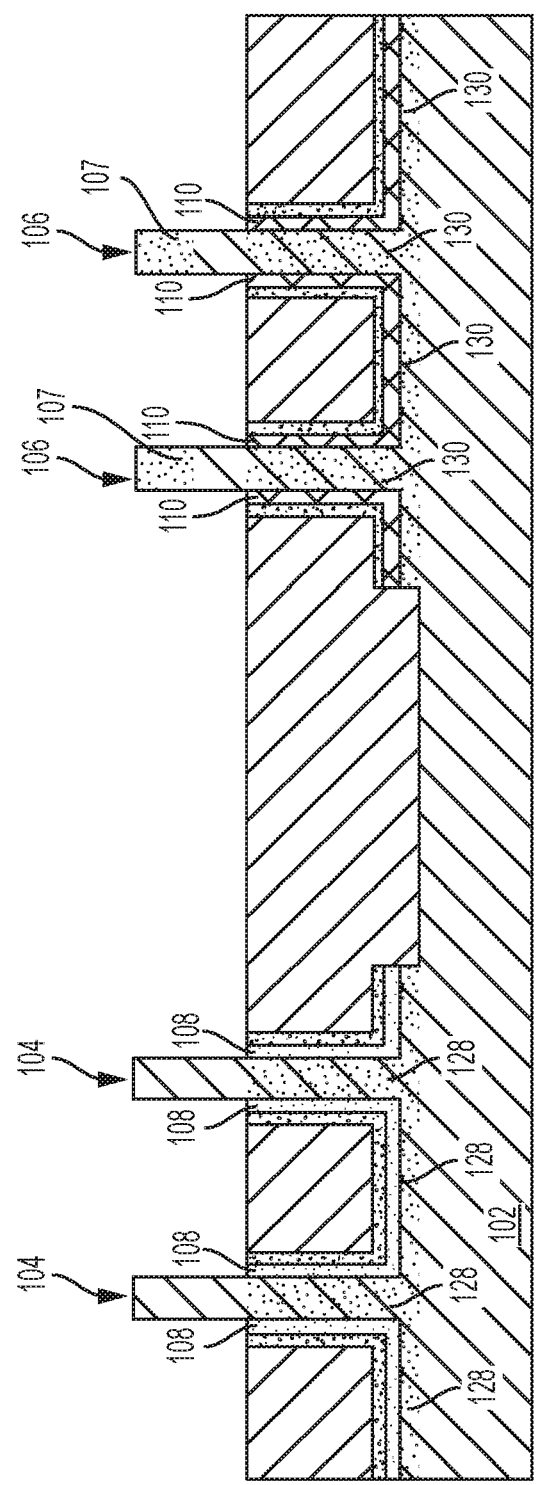

FIG. 7 is a cross-sectional view of the FET 100 having doped portions 128, 130 of the fins and substrate that are adjacent to the BSG layer 108 and PSG layer 110. Following the fin reveal, it may be beneficial to dope portions of the fins 104, 106 and/or substrate 102 with boron (B) and/or phosphorous (P) type dopants. Specifically, the fins and substrate adjacent to the BSG layer of the NFET region 128 can, in some aspects, be doped with a B type dopant. Similarly, the fins and substrate adjacent to the PSG layer of the PFET region 130 can be doped with a P type dopant. In some aspects, the doping process can include an annealing step to aid in diffusion of the dopant into the adjacent PTS regions 128, 130. As such PTS regions 128, 130—i.e., a portion of the fins 104, 106 are doped under the respective fin channels—are formed. In such an annealing step, the FET 100 can be, for example, heated and slowly cooled.

Figure 8:
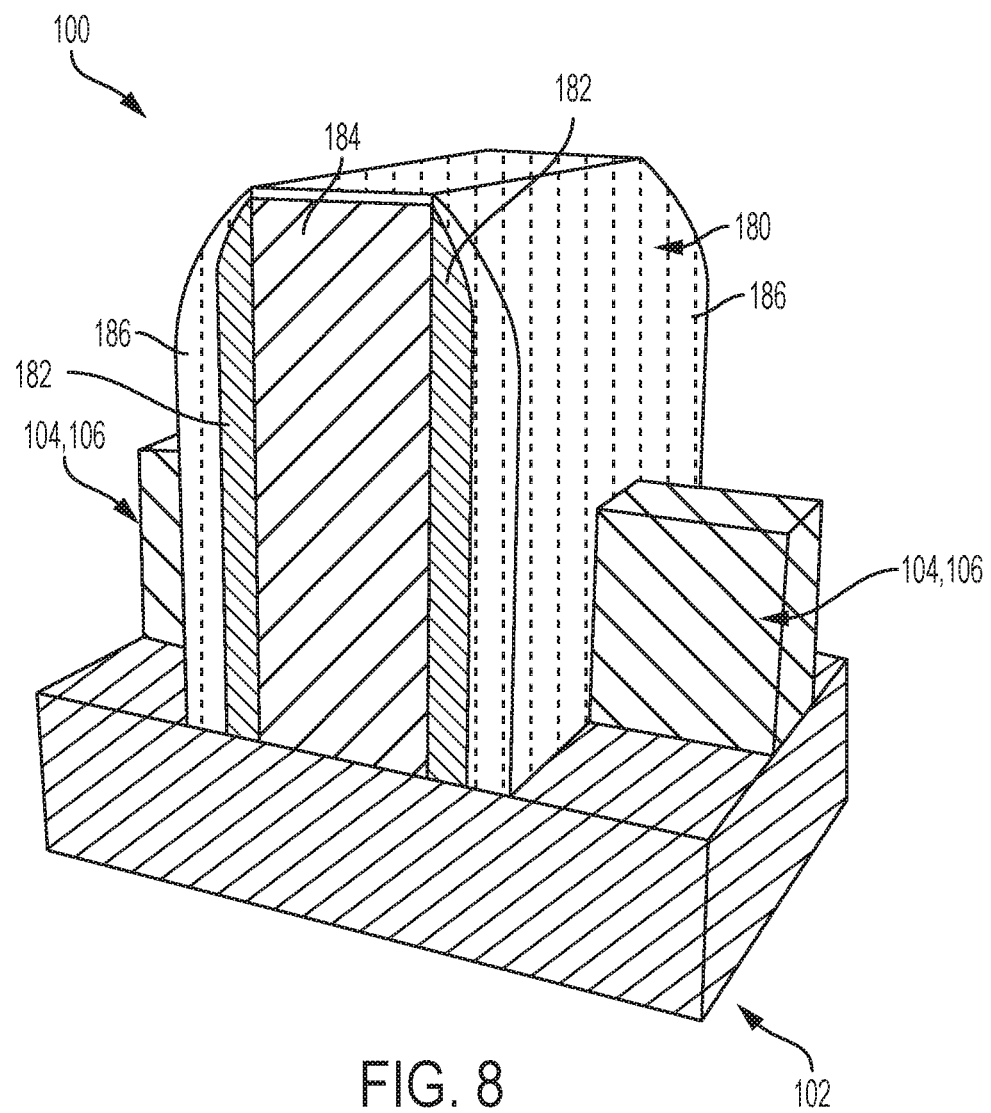
FIG. 8 is a cross-section view of an example gate formed on a fin of the PTS.

Finally, following doping and annealing of the adjacent regions 128, 130, the FET structure 100 can have at least one gate formed thereon. FIG. 8 is a cross-section view of an example gate stack 180 formed on a fin 104 of the FET 100. The gate stack 180 can be formed of any suitable gate forming method. As such, the gate stack 180 can include a high-k dielectric layer 182 and a gate metal region 184.

Any suitable gate formation techniques may be employed. For example, in one aspect a gate first process is utilized. In such a gate first process, a gate dielectric layer—such as a high-k layer—can be deposited along the surface of the FET 100, including over the revealed fins and STI oxide layer. Gate metal can then be deposited on the high-k layer to form the gate regions. After the gate metal is deposited, a photolithographic patterning and etching process such as, for example, reactive ion etching (RIE) is performed to pattern the gate stack 180. Subsequently, a spacer 186 is formed by, for example, depositing a layer of nitride or oxide material and performing an anisotropic etching process to define the spacer 186 along sidewalls of the gate stack 180. Following the formation of the spacers 186 active regions may be formed from the fins 104, 106 by a suitable process. In one embodiment, an epitaxial growth process may be performed that grows a semiconductor material from exposed portions of the fins 104, 106. Following the epitaxial growth process, ion implantation and annealing may be performed to diffuse dopants into the fins 104,106. In other embodiments, the dopants may be added in-situ during the epitaxial growth process.

In an alternative exemplary embodiment, the FET devices may be formed using a gate last process. In such a process, following the formation of the fins and the FET 100, a layer of dummy gate material, such as, for example, a polysilicon material and a layer of hard mask material is deposited over the fins 104, 106. A photolithographic masking and etching process such as, for example, RIE is performed to pattern dummy gate stacks. Following the formation of the dummy gate stacks, a spacer material layer is deposited and etched to form spacers 186 adjacent to the sidewalls of the dummy gate stack. The fins 104, 106 may be doped to form active regions by any suitable process such as, for example, an ion implantation and annealing process, or an epitaxial growth process. After the active regions are formed, an insulator layer, such as, for example, an oxide layer may be disposed and planarized to expose the dummy gate stacks. The dummy gate stacks are removed, and replaced with replacement metal gate 184 materials.

Following the formation of the gates, conductive contacts may be formed by, for example, etching vias in the insulator layer to expose the active regions of the devices, and depositing conductive material in the vias (not shown).

It will further be appreciated by one of ordinary skill in the art that the fins can also be modified, i.e., widened, using epitaxial growth either before, during, or after gate formation. As used herein, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

As used herein, removal is any process that removes material from the wafer: examples include etch processes (either wet or dry), and chemical-mechanical planarization (CMP), etc.

As used herein, patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A self-aligned field effect transistor structure, comprising:
   a bulk substrate having a plurality of fins patterned therein;
   an n-type field effect transistor region formed of at least one of the plurality of fins patterned on the substrate, the n-type field effect transistor region having a boron doped layer formed on a portion of the fin and a first hardmask layer formed on the boron doped layer of the n-type field effect transistor region;
   a p-type field effect transistor region formed of at least one of the plurality of fins patterned on the substrate, the p-type field effect transistor region having a phosphorous or arsenic doped layer formed on a portion of the fin and a second hardmask layer formed on the phosphorous or arsenic doped layer of the p-type field effect transistor region, wherein the phosphorous or arsenic doped layer is in direct contact with the portion of the fin;
   a boundary region between the n-type field effect transistor region and the p-type field effect transistor region comprising an insulator material disposed between the n-type field effect transistor region and the p-type field effect transistor region such that there is a separation between the boron doped layer of the n-type field effect transistor region and the phosphorous or arsenic doped layer of the p-type field effect transistor region;
   wherein the boron doped layer and the phosphorous or arsenic doped layer do not physically contact each other;
   wherein the insulator material is disposed between the first hardmask layer and the second hardmask layer;
   wherein the insulator material does not physically contact the plurality of fins; and
   wherein the insulator material is in physical contact with the bulk substrate in the boundary region.

2. The self-aligned field effect transistor structure of claim 1, wherein the at least one of the plurality of fins forming the p-type field effect transistor region comprises a silicon germanium material.

3. The self-aligned field effect transistor structure of claim 1, wherein an unrevealed portion of the at least one of the plurality of fins forming the p-type field effect transistor region is doped with a phosphorous type dopant.

4. The self-aligned field effect transistor structure of claim 1, wherein an unrevealed portion of the at least one of the plurality of fins forming the n-type field effect transistor region is doped with a boron type dopant.

5. The self-aligned field effect transistor structure of claim 1, further comprising at least one gate.

6. The self-aligned field effect transistor structure of claim 1, wherein the boron doped layer of the n-type field effect transistor region is conformally deposited on top of the plurality of fins.

7. The self-aligned field effect transistor structure of claim 6, wherein the boron doped layer of the n-type field effect transistor region is a layer that is deposited by chemical vapor deposition or atomic layer deposition.

8. The self-aligned field effect transistor structure of claim 1, wherein the phosphorous or arsenic doped layer of the p-type field effect transistor region is conformally deposited on top of the plurality of fins.

9. The self-aligned field effect transistor structure of claim 8, wherein the phosphorous or arsenic doped layer of the p-type field effect transistor region is a layer that is deposited by chemical vapor deposition or atomic layer deposition.

10. The self-aligned field effect transistor structure of claim 1, wherein the boron doped layer of the n-type field effect transistor region has a thickness of 1 nm to 10 nm.

11. The self-aligned field effect transistor structure of claim 1, wherein the phosphorous or arsenic doped layer has a thickness of 1 nm to 10 nm.

12. The self-aligned field effect transistor structure of claim 1, wherein the insulator material comprises a shallow trench isolation oxide.

13. The self-aligned field effect transistor structure of claim 1, wherein at least one of the plurality of fins is doped under a fin channel.

14. The self-aligned field effect transistor of claim 5, wherein the gate comprises a high-k dielectric layer.

15. The self-aligned field effect transistor of claim 5, wherein the gate comprises a gate metal region.

* * * * *